(12) United States Patent
Ma et al.

(10) Patent No.: US 11,756,905 B2
(45) Date of Patent: Sep. 12, 2023

(54) PACKAGE INTERFACE WITH IMPROVED IMPEDANCE CONTINUITY

(71) Applicant: Credo Technology Group Limited, Grand Cayman (KY)

(72) Inventors: Mengying Ma, Shanghai (CN); Xike Liu, Shanghai (CN); Xiangxiang Ye, Shanghai (CN); Xin Wang, Shanghai (CN)

(73) Assignee: Credo Technology Group Limited, Grand Cayman (KY)

( * ) Notice: Subject to any disclaimer, the term of this patent is extended or adjusted under 35 U.S.C. 154(b) by 88 days.

(21) Appl. No.: 17/194,390

(22) Filed: Mar. 8, 2021

(65) Prior Publication Data
US 2021/0375798 A1 Dec. 2, 2021

(30) Foreign Application Priority Data
May 28, 2020 (CN) .......................... 202010469318.X

(51) Int. Cl.
*H01L 23/66* (2006.01)
*H03H 11/28* (2006.01)
(Continued)

(52) U.S. Cl.
CPC ........ *H01L 23/66* (2013.01); *H01L 23/49838* (2013.01); *H01L 24/81* (2013.01);
(Continued)

(58) Field of Classification Search
None
See application file for complete search history.

(56) References Cited

U.S. PATENT DOCUMENTS 5,969,929 A 10/1999 Kleveland et al.
8,368,174 B1 * 2/2013 Jiang .................... H01L 23/645
257/531

(Continued)

FOREIGN PATENT DOCUMENTS

CN 109388826 A 2/2019
CN 111415920 A 7/2020

OTHER PUBLICATIONS

Gupta, et al. CMOS Voltage Level-Up Shifter—A Review, International Journal of Advances in Engineering Sciences vol. 3 (3), Jul. 2013.

(Continued)

*Primary Examiner* — Long Pham
(74) *Attorney, Agent, or Firm* — Ramey LLP; Daniel J. Krueger

(57) ABSTRACT

An illustrative embodiment of a packaged integrated circuit includes: an integrated circuit chip having a SerDes signal pad; and a package substrate having a core via and an arrangement of micro-vias connecting the SerDes signal pad to an external contact for solder ball connection to a PCB trace. The core via has a first parasitic capacitance, the solder ball connection is associated with a second parasitic capacitance, and the arrangement of micro-vias provides a pi-network inductance that improves connection impedance matching. An illustrative method embodiment includes: obtaining an expected impedance of the PCB trace; determining parasitic capacitances of a core via and a solder ball connection to the PCB trace; minimizing the core via capacitance; calculating a pi-network inductance that improves impedance matching with the PCB trace; and adjusting a micro-via arrangement between the core via and the solder ball connection to provide the pi-network inductance.

14 Claims, 4 Drawing Sheets

(51) Int. Cl.
*H03M 9/00* (2006.01)
*H01L 23/00* (2006.01)
*H01L 23/498* (2006.01)

(52) U.S. Cl.
CPC .............. *H03H 11/28* (2013.01); *H03M 9/00* (2013.01); *H01L 2223/6616* (2013.01); *H01L 2224/81908* (2013.01); *H01L 2224/81986* (2013.01); *H01L 2924/30105* (2013.01); *H01L 2924/30111* (2013.01)

(56) References Cited

U.S. PATENT DOCUMENTS

| | | |
|---|---|---|
| 9,166,591 B1 | 10/2015 | Chan et al. |
| 9,543,757 B2 | 1/2017 | Tsai |
| 2019/0050519 A1 | 2/2019 | Dai |

OTHER PUBLICATIONS

Wang, et al. Low-Power Small-Area Digital I/O Cell, IEEE Transactions on Circuits and Systems—II: Express Briefs, vol. 52, No. 8, Aug. 2005.
STA—Static Timing Analysis, Lecturer: Gil Rahav, Semester B', EE Dept. BGU, Freescale Semiconductors Israel, downloaded from www.ee.bgu.ac.il/~digivlsi/slides/STA_9_1.pdf on Jun. 16, 2017.
Galal, Sherif. Broadband ESD Protection Circuits in CMOS Technology, IEEE Journal of Solid-State Circuits, Dec. 2003, 2334-2340, vol. 38, No. 12.
Kim, et al. Spiral Via Structure in a BGA Package to Mitigate Discontinuities in Multi-Gigabit SERDES System; 978-1-4244-6412-8/10 2010 IEEE.
Non-Final Office Action dated Aug. 23, 2019 in U.S. Appl. No. 16/026,950.
Notice of Allowance dated Mar. 26, 2020 in U.S. Appl. No. 16/026,950.

* cited by examiner

PACKAGE INTERFACE WITH IMPROVED IMPEDANCE CONTINUITY

BACKGROUND

Digital communications occur between sending and receiving devices over an intermediate communications medium, or "channel" (e.g., optical fibers, insulated wires, printed circuit board ("PCB") traces). Each sending device typically transmits symbols at a fixed symbol rate, while each receiving device detects a (potentially corrupted) sequence of symbols from which the transmitted data is reconstructed. Many digital communication links use only one bit per symbol, but higher-order signal constellations are known and frequently used. In 4-level pulse amplitude modulation ("PAM4"), each symbol interval may carry any one of four symbols, denoted as −3, −1, +1, and +3.

Channel non-idealities produce dispersion which may cause each symbol to perturb its neighboring symbols, a consequence known as inter-symbol interference ("ISI"). ISI can make it difficult for the receiving device to determine which symbols were sent in each interval, particularly when such ISI is combined with additive noise. The effects of channel dispersion and ISI become increasing severe as symbol rates are pushed ever higher. To combat noise and ISI, transmitting and receiving devices may employ various equalization techniques including linear equalizers and decision feedback equalizers.

Serializer/Deserializer ("SerDes") blocks are functional modules that convert between (lower rate) parallel symbol streams and (higher rate) serial symbol streams. Integrated circuits often incorporate SerDes blocks to reduce the number of physical input/output ("I/O") pins and/or external signal lines needed for communication. SerDes blocks are generally designed to operate at the highest possible symbol rates to maximize their benefit, and accordingly they are the modules that most benefit from the use of efficient design techniques.

As individual lane data rates move toward 56 Gbps and beyond, any impedance mismatches increasingly exacerbate signal attenuation and ISI. The connections between packaged integrated circuit chips and printed circuit board traces are common causes of impedance mismatch for which an efficient design solution is sought.

SUMMARY

Accordingly, there are disclosed herein packaged integrated circuit interface designs and associated methods for efficiently improving impedance continuity for high bandwidth signal connections. An illustrative embodiment of a packaged integrated circuit includes: an integrated circuit chip having a SerDes signal pad; and a package substrate having a core via and an arrangement of micro-vias connecting the SerDes signal pad to an external contact for solder ball connection to a PCB trace. The core via has a first parasitic capacitance, the solder ball connection is associated with a second parasitic capacitance, and the arrangement of micro-vias provides a pi-network inductance that, together with the first and second parasitic capacitances, yields a connection impedance matching an expected impedance of the PCB trace.

An illustrative embodiment of a method for providing a connection from an integrated circuit signal pad to a printed circuit board trace is disclosed. The method includes: obtaining an expected impedance of the PCB trace; determining a first parasitic capacitance of a core via; estimating a second parasitic capacitance of a solder ball connection between a package substrate pad and the PCB trace; minimizing the first parasitic capacitance subject to one or more design constraints; calculating a pi-network inductance that, together with the first and second parasitic capacitances, matches the expected impedance of the PCB trace; and adjusting a micro-via arrangement between the core via and the solder ball connection to provide the pi-network inductance.

An illustrative software embodiment includes a non-transitory information storage medium that configures one or more processors to implement the foregoing method.

Each of the foregoing embodiments may be employed alone or in combination, and may further be implemented with any one or more of the following optional features in any suitable combination. 1. the IC pad is a SerDes transmitter output, the SerDes transmitter supplying a signal having a symbol rate greater than 10 GHz. 2. the expected impedance is a function of frequency. 3. said impedance match occurs at half of the symbol rate. 4. the micro-via arrangement includes at least two micro-vias, and said adjusting includes increasing an offset between the at least two micro-vias. 5. said adjusting includes making a length of a trace connecting the offset micro-vias greater than the offset distance. 6. said adjusting includes offsetting a first micro-via in a first direction from a second micro-via, and offsetting a third micro-via from the second micro-via in a direction perpendicular to the first direction.

TERMINOLOGY

Figure 1:
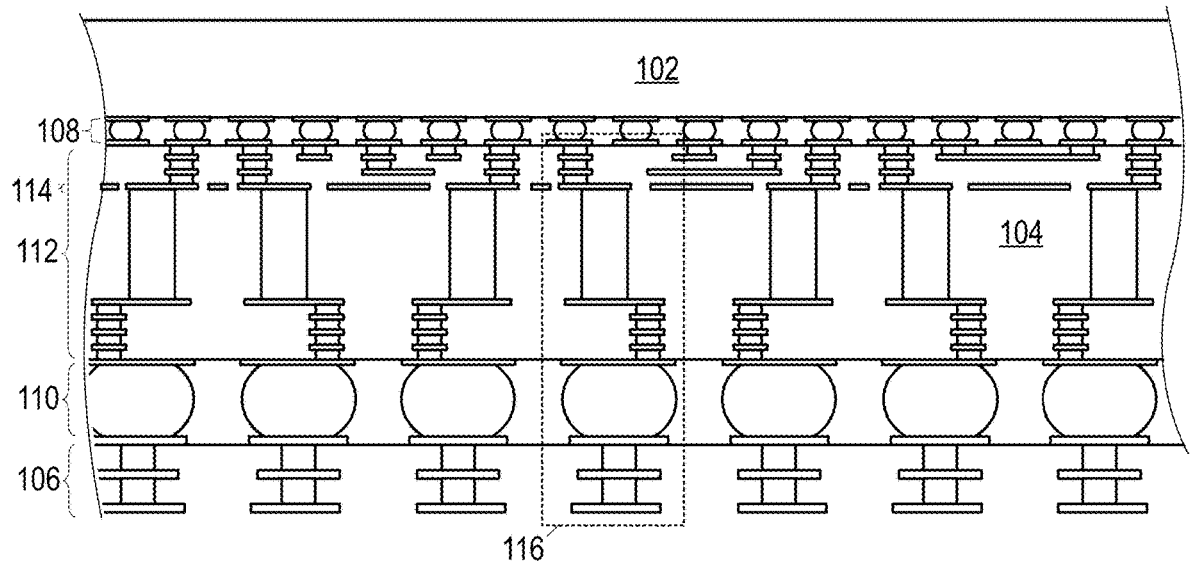
FIG. 1 is a cross-section of an illustrative IC package interface.

An integrated circuit ("IC") die is a diced unit of an IC wafer. (Herein, "dice" will be employed as the plural form of a die.) The packaged form of a singular IC die, with nodes, pins, posts, pads, terminals, leads, bumps, balls, or other electrical contacts (collectively referenced herein as "contacts") ready for soldering or other electrically-connected incorporation into a larger electrical circuit or system, may be termed an IC chip. When multiple IC dice are packaged together, e.g., as a multi-chip module or system-in-package, the packaged unit is herein termed a "microelectronic assembly". The multiple IC dice may be attached directly to the package substrate, which can take the form of a laminated circuit board or a ceramic, glass, or semiconductor substrate, and generally has printed or etched traces significantly (orders of magnitude) larger than the traces on the IC dice. As this size discrepancy can adversely affect communications performance between the IC dice, at least some microelectronic assemblies employ so-called 2.5D or 3D technologies. In 3D technology, the IC dice are stacked atop each other to provide direct electrical connections between adjacent dice. However, such stacking can make it difficult for the package to provide adequate heat dissipation.

In 2.5D technology, at least some of the IC dice are attached to an "interposer", which in turn may be attached to the package substrate. The interposer may be a silicon substrate that employs through-silicon vias (TSVs) to provide contacts on both its upper surface (for the IC dice) and its lower surface (for the package substrate). Traces on the interposer can more closely match the size of the traces on the IC dice for improved communications performance between the dice, and may incorporate intentional inductance and capacitance elements to provide better impedance matching with the contacts and traces on the package substrate. So long as their density and power dissipation is constrained, a limited number of active devices (e.g., transistors) may be incorporated into the interposer without facing the heat dissipation difficulties of 3D technology.

The term "substrate", when unqualified, may refer to a package substrate, an interposer, an IC die, or any other form of platform that provides contacts for electrically connecting the integrated circuit elements of the die to the other elements or external contacts of the microelectronic assembly.

DETAILED DESCRIPTION

Though specific embodiments are given in the drawings and the following description, keep in mind that they do not limit the disclosure. On the contrary, they provide the foundation for one of ordinary skill to discern the alternative forms, equivalents, and modifications that are encompassed in the scope of the appended claims.

The manufacturing processes for electronic devices vary widely, but typically they involve the use of printed circuit boards ("PCBs") to interconnect packaged integrated circuit chips with each other and with the various mechanisms for interacting with their users and environments. The chips have contacts that are soldered to corresponding contacts on the PCB. These connections create an impedance mismatch for signals conveyed by PCB traces to or from the chips. These impedance mismatches are normally insignificant in the frequency ranges used by most electronic devices, but serializer-deserializer (SerDes) communication links are pushing symbol rates to 10 GHz or higher where such impedance mismatches can cause significant reflections and attenuation.

FIG. 1 is a partial cross-section of an integrated circuit chip, showing a die 102 mounted to a package substrate 104, which in turn is soldered to printed circuit board contacts 106. An array of solder connections 108 electrically connects pads of the die 102 to corresponding inner contacts of the package substrate 104, and an array of solder balls 110 connects external contacts of the package substrate 104 to the PCB contacts 106. The package substrate includes an arrangement 112 of traces and vias to provide electrical connections between the inner contacts and outer contacts, and typically includes one or more ground planes 114 to reduce cross-talk between layers. The ground plane includes "anti-pads", or openings, where connections need to be made between overlying and underlying layers.

Connection 116 is one instance of an electrical path from an inner contact of the package substrate to a PCB trace, including a core via, micro-vias, and a solder ball. The particulars of the connection geometry are discussed further below.

The connection impedance is conventionally calculated by simulating the electromagnetic characteristics of the proposed geometry for the substrate conductors. However, FIG. 2 shows a simplified model that has been found useful.

Figure 2:
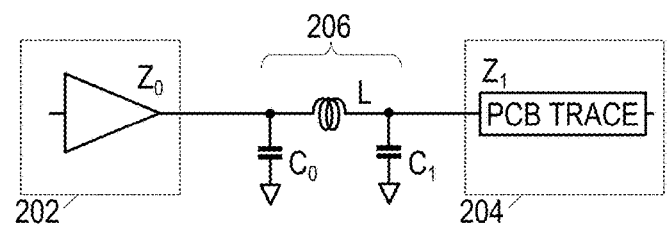
FIG. 2 is schematic of an illustrative interface model.

In the illustrative interface model of FIG. 2, a SerDes (serializer/deserializer) transmitter 202 has an output impedance $Z_0$ and the printed circuit board trace 204 (typically implemented as a strip line in the frequency range of interest) has a characteristic impedance, also referred to here as input impedance, $Z_1$. The impedance of connection 116 is dominated by the parasitic capacitance $C_0$ of the core via and the parasitic capacitance $C_1$ of the solder ball 110. A series inductance L is herein introduced between the two parasitic capacitances to form a "pi-network" 206 (so named because the schematic takes the shape of the Greek letter π). Pi networks are frequently used for impedance matching, so this approach facilitates reducing the impedance discontinuity across the package substrate. Using this model, the discontinuity is minimized when the output impedance $Z_0$ matches the characteristic impedance $Z_1$, and $$Z_1 = \sqrt{\frac{L}{(C_0 + C_1)}},$$

or equivalently, when the pi network inductance is set to $$L = (C_0 + C_1)Z_1^2.$$

Though the FIG. 2 model is for signals output (transmitted) from the integrated circuit die, the model for signals input to (received by) the SerDes receiver is equivalent, and the same inductance calculation may be performed.

Figure 3A:
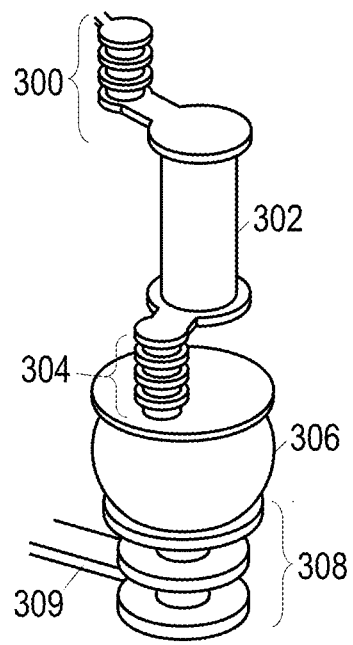
FIGS. 3A-3D are isometric views of alternative package substrate connection geometries.

FIG. 3A is a perspective view of the geometry for connection 116. It includes: a first micro-via arrangement 300 including short interconnecting traces or pads at each layer on the internal side of the package substrate, a core via 302 that connects between the package substrate's internal and external sides, a second micro-via arrangement 304 that couples the signal through the layers on the external side of the package substrate, a solder ball 306 connecting an external contact of the package substrate to a corresponding pad on the printed circuit board, and a PCB via arrangement 308 that couples the solder pad to the target PCB trace.

Because the core via 302 is normally created by drilling a hole through the substrate and plating the sides with a conductive material (i.e., a "plated thru-hole"), while the micro-vias and interconnecting traces are created using photolithography to pattern the added layers, the core via dimensions are much larger, creating a significant parasitic capacitance $C_0$. The dimensions of the solder ball 306 are similarly large, creating the second parasitic capacitance $C_1$.

Often, the parasitic capacitance can be reduced somewhat. If the conductor dimensions are already at a minimum, a common technique is to increase the anti-pad dimensions of any ground plane(s) near the core via or external contact. While effective, certain design constraints may limit the benefit that this technique can provide. The increase in anti-pad dimension (and associated reduction in ground plane coverage) impairs return current continuity, increases crosstalk between conductors, and consumes signal routing area. Where such techniques are insufficient, the traces may be lengthened between the core via and the solder ball to introduce a compensatory inductance. The desired inductance value can be readily determined using the pi network model discussed previously.

Figure 3B:
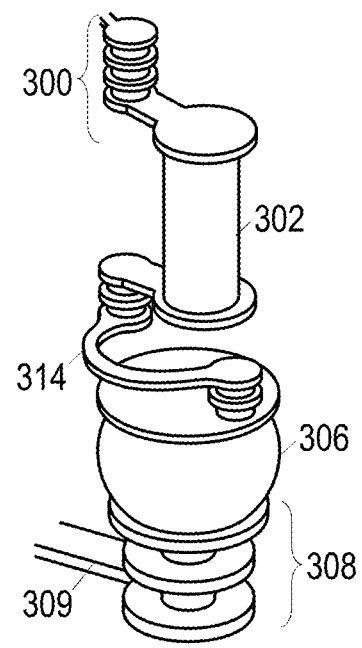

FIG. 3B shows the connection geometry associated with a first impedance matching technique. In the embodiment of FIG. 3B, the micro-via arrangement 304 is modified by introducing an offset between two of the micro-vias and increasing the length of a interconnecting trace 314 beyond the offset distance. In the frequency range of interest, the desired inductive impedance may be achievable with a relatively modest increased trace length.

Figure 3C:
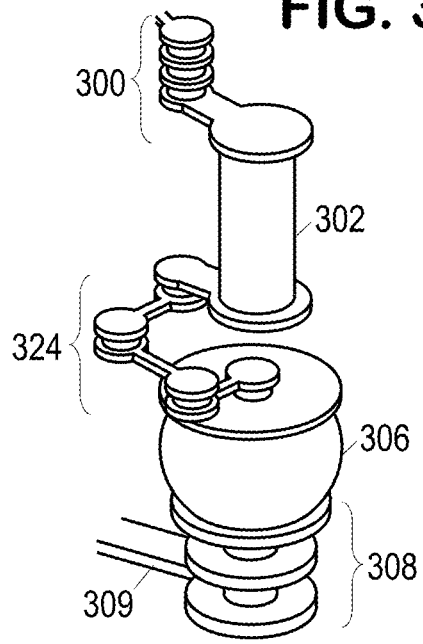

FIG. 3C shows the connection geometry associated with an alternative impedance matching technique. In the embodiment of FIG. 3C, the micro-via arrangement 304 is modified by introducing an offsets between three or more of the micro-vias, with the offset directions being systematically changed to emulate at least a portion of a helical winding 324. In the illustrated embodiment, each offset direction is perpendicular to a preceding offset. direction, but the change in directions may be a function of the number of layers on the external side of the substrate.

Figure 3D:
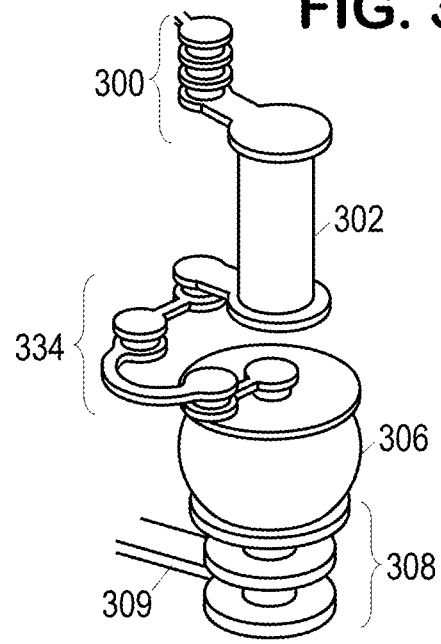

For additional inductance enhancement, the techniques may be repeated (e.g., in additional layers) and/or combined as shown by the micro-via arrangement 334 in FIG. 3D. In the embodiment of FIG. 3D, multiple offsets are provided, and one of the traces is arced to make its length greater than the offset distance.

Figure 4:
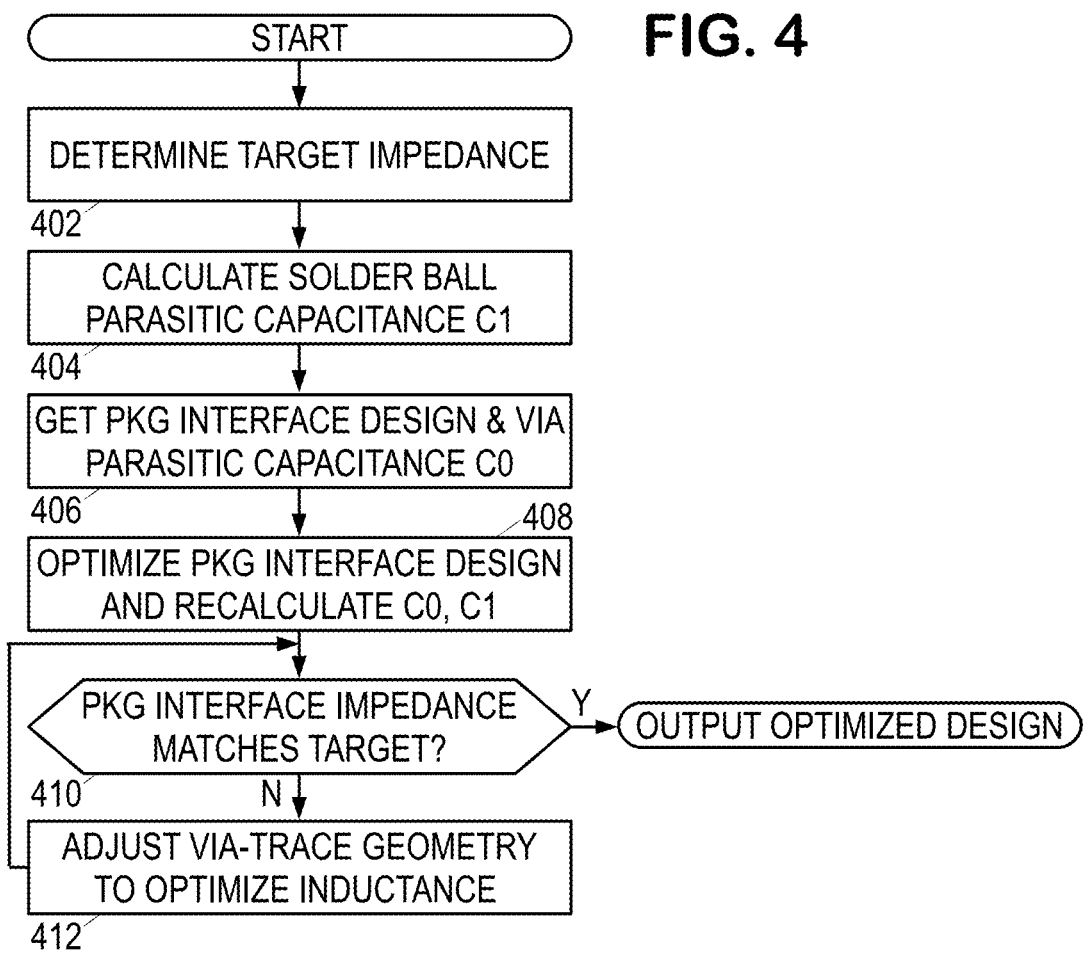
FIG. 4 is a flow diagram of an illustrative interface design method.

FIG. 4 is a flow diagram of an illustrative method for designing SerDes connections in a package substrate. The process may be implemented, e.g., by one or more processors executing software for patterning the package substrate to which the integrated circuit die will be mounted. In block 402, the design system determines the target impedance value associated with the PCB trace ($Z_1$). In block 404, the system calculates the parasitic capacitance of the solder ball ($C_1$). Both $Z_1$ and $C_1$ may be standardized or expected values, or if the PCB geometry is known, they may be values determined by simulation or measurement.

In block 406, the system obtains the initial layout design for the package substrate and determines the parasitic capacitance ($C_0$) associated with the core via. Models exist for estimating the parasitic capacitance based on the via dimensions and separations from nearest current return path in each layer, though measurement via simulation is also feasible.

In block 408, the system compares the connection impedance (approximated by $\sqrt{L/(C_0+C_1)}$) to the target impedance and, subject to design constraints, adjusts the dimensions of the core via and nearby ground planes to reduce any mismatch as much as possible.

In block 410, the system determines whether an adequate impedance match has been achieved, and if not, the system in block 412 determines the desired pi-network inductance L and modifies the micro-via arrangement 304 between the core via and the solder ball to introduce the desired inductance. Various modifications may be tried and evaluated to verify that the desired impedance match is achieved. Once it has, the system outputs the optimized design, e.g., by displaying it to a user, storing it on a non-transitory information storage medium, and/or providing it to equipment that manufactures the package substrate and mounts the integrated circuit die.

Figure 5A:
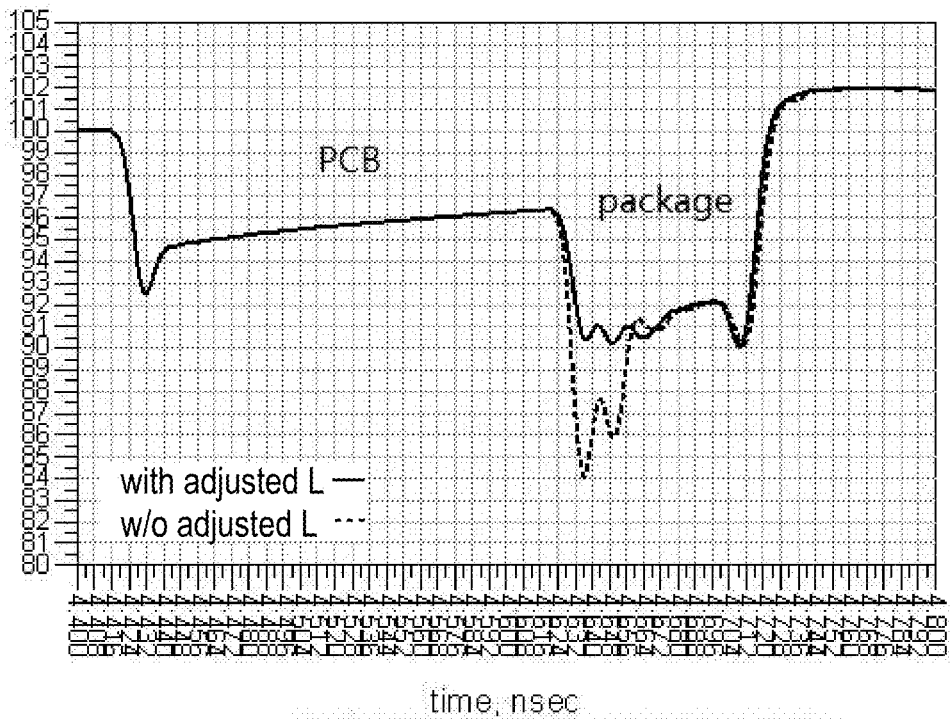
FIG. 5A is a graph comparing time-domain reflectometry (TDR) impedance before and after optimization.

FIG. 5A is a time-domain reflectometry (TDR) graph showing impedance (in ohms) as a function of distance (or equivalently, as a function of propagation time). The package substrate without the pi-network inductance exhibits a sharp drop in impedance from 96 ohms to about 85 ohms where the PCB trace is connected to the package substrate. With the pi-network inductance, the impedance discontinuity is reduced by over 50%.

Figure 5B:
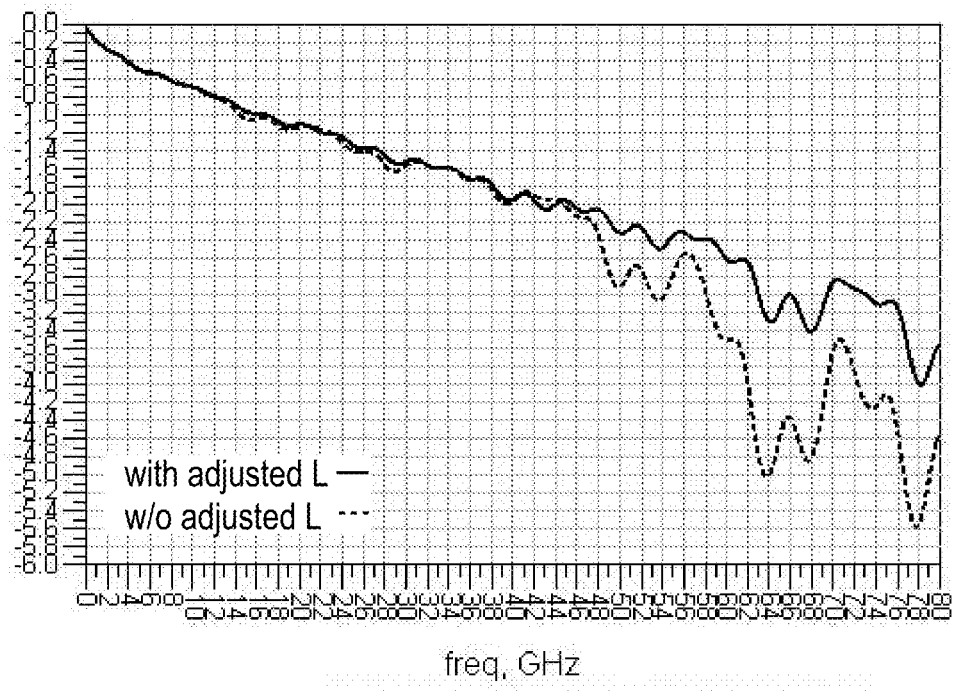
FIG. 5B is a graph comparing injection loss spectra before and after optimization.

FIG. 5B shows the signal injection loss (in dB) as a function of frequency (in GHz) across the package substrate and PCB trace. Without the pi-network inductance, the magnitude of the loss exhibits a gradual slope from zero to about 46 GHz, where it begins increasing more rapidly. With the pi-network inductance, the loss returns to the previous slope (attributable mainly to the PCB trace). Though the difference is already significant (0.2 dB) at 56 GHZ, it quickly reaches 1.6 dB above 60 GHz.

Numerous alternative forms, equivalents, and modifications will become apparent to those skilled in the art once the above disclosure is fully appreciated. It is intended that the claims be interpreted to embrace all such alternative forms, equivalents, and modifications that are encompassed in the scope of the appended claims.

What is claimed is:

1. A method of providing a connection from an integrated circuit signal pad to a printed circuit board trace, the method comprising:
    obtaining an expected impedance of the PCB trace;
    determining a first parasitic capacitance of a core via;
    estimating a second parasitic capacitance of a solder ball connection between a package substrate pad and the PCB trace;
    calculating a pi-network inductance that, together with the first and second parasitic capacitances, provides impedance matching with the expected impedance of the PCB trace; and
    adjusting a micro-via arrangement between the core via and the solder ball connection to provide the pi-network inductance, the micro-via arrangement including at least a first, second, and third micro-vias, wherein said adjusting includes:
        offsetting the second micro-via in a first direction from the first micro-via; and
        offsetting the third micro-via from the second micro-via in a direction perpendicular to the first direction.

2. The method of claim 1, wherein the IC pad is a SerDes transmitter output, the SerDes transmitter supplying a signal having a symbol rate greater than 10 GHz.

3. The method of claim 1, wherein the expected impedance is a function of frequency, wherein the PCB trace is for conveying a signal having a symbol rate, and wherein said impedance matching occurs at half of the symbol rate.

4. The method of claim 1, wherein the micro-via arrangement includes at least two micro-vias, and wherein said adjusting includes increasing an offset between the at least two micro-vias.

5. The method of claim 4, wherein said adjusting further includes making a length of a trace connecting the offset micro-vias greater than the offset distance.

6. A packaged integrated circuit comprising:
    an integrated circuit die having a SerDes signal pad; and
    a package substrate having a core via and an arrangement of micro-vias connecting the SerDes signal pad to an external contact for solder ball connection to a PCB trace, the core via having a first parasitic capacitance, the solder ball connection being associated with a second parasitic capacitance, and the arrangement of micro-vias providing a pi-network inductance that, together with the first and second parasitic capacitances, yields a connection impedance matching an expected impedance of the PCB trace,
    wherein the micro-via arrangement includes at least a first, second, and third micro-vias, the second micro-via being offset in a first direction from the first micro-via, and the third micro-via being offset from the second micro-via in a direction perpendicular to the first direction.

7. The integrated circuit of claim 6, wherein the SerDes signal pad is a transmitter output, the transmitter supplying a signal having a symbol rate greater than 10 GHz.

8. The integrated circuit of claim 6, wherein the expected impedance is a function of frequency, and wherein said impedance match occurs at half of the symbol rate.

9. The integrated circuit of claim 6, wherein the micro-via arrangement includes at least two micro-vias that are offset to increase the pi-network inductance.

10. The integrated circuit of claim 9, wherein a trace connecting the at least two micro-vias has a length greater than the offset distance.

11. A non-transitory information storage medium having software that causes one or more processors to implement a method that comprises:
   obtaining an expected impedance of a PCB trace;
   determining a first parasitic capacitance of a core via;
   estimating a second parasitic capacitance of a solder ball connection between a package substrate pad and the PCB trace;
   calculating a pi-network inductance that, together with the first and second parasitic capacitances, provides impedance matching with the expected impedance of the PCB trace; and
   adjusting a micro-via arrangement between the core via and the solder ball connection to provide the pi-network inductance, the micro-via arrangement including at least a first, second, and third micro-vias, wherein said adjusting includes:
      offsetting the second micro-via in a first direction from the first micro-via; and
      offsetting the third micro-via from the second micro-via in a direction perpendicular to the first direction.

12. The medium of claim 11, wherein the expected impedance is a function of frequency, wherein the PCB trace is for conveying a signal having a symbol rate, and wherein said impedance matching occurs at half of a symbol rate of a signal to be conveyed to the PCB trace.

13. The medium of claim 11, wherein the micro-via arrangement includes at least two micro-vias, and wherein said adjusting includes increasing an offset between the at least two micro-vias.

14. The medium of claim 13, wherein said adjusting further includes making a length of a trace connecting the offset micro-vias greater than the offset distance.

* * * * *